(12) United States Patent
Chan et al.

(10) Patent No.: US 9,023,697 B2
(45) Date of Patent: May 5, 2015

(54) 3D TRANSISTOR CHANNEL MOBILITY ENHANCEMENT

(71) Applicants: International Business Machines Corporation, Armonk, NY (US); GlobalFoundries, Inc., Grand Cayman (KY)

(72) Inventors: Kevin K. Chan, Staten Island, NY (US); Dae-Gyu Park, Poughquag, NY (US); Xinhui Wang, Poughkeepsie, NY (US); Yun-Yu Wang, Poughquag, NY (US); Min Yang, Yorktown Heights, NY (US); Qi Zhang, Hopewell Juction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/962,322

(22) Filed: Aug. 8, 2013

(65) Prior Publication Data

US 2015/0041911 A1    Feb. 12, 2015

(51) Int. Cl.
*H01L 21/8238* (2006.01)
*H01L 27/092* (2006.01)

(52) U.S. Cl.
CPC .... *H01L 21/823821* (2013.01); *H01L 27/0924* (2013.01); *H01L 21/823814* (2013.01)

(58) Field of Classification Search
CPC ............... H01L 21/823821; H01L 21/823814; H01L 27/0924
USPC ........................................... 257/369; 438/199
See application file for complete search history.

(56) References Cited

U.S. PATENT DOCUMENTS

| 6,395,587 | B1 | 5/2002 | Crowder et al. |
| 8,334,185 | B2 | 12/2012 | Kronholz et al. |
| 8,435,845 | B2* | 5/2013 | Ning et al. .................... 438/186 |
| 2004/0219722 | A1* | 11/2004 | Pham et al. .................... 438/157 |
| 2006/0284255 | A1* | 12/2006 | Shin et al. ..................... 257/351 |
| 2010/0072553 | A1 | 3/2010 | Xu et al. |
| 2010/0117159 | A1* | 5/2010 | Lindsay ........................ 257/369 |
| 2010/0127327 | A1 | 5/2010 | Chidambarrao |
| 2010/0308381 | A1* | 12/2010 | Luning et al. ................. 257/288 |
| 2011/0042744 | A1* | 2/2011 | Cheng et al. .................. 257/347 |
| 2011/0068375 | A1 | 3/2011 | Jakschik et al. |
| 2011/0079855 | A1 | 4/2011 | Chan et al. |
| 2011/0084336 | A1 | 4/2011 | Luning et al. |
| 2011/0097881 | A1* | 4/2011 | Vandervorst et al. ......... 438/486 |
| 2011/0151652 | A1* | 6/2011 | Sssaki et al. ................. 438/513 |
| 2011/0169085 | A1 | 7/2011 | Xu et al. |
| 2011/0212601 | A1 | 9/2011 | Moroz et al. |
| 2011/0266622 | A1 | 11/2011 | Luning et al. |

(Continued)

*Primary Examiner* — Jarrett Stark
*Assistant Examiner* — Mohammad M Hoque
(74) *Attorney, Agent, or Firm* — Yuanmin Cai; L. Jeffrey Kelly

(57) ABSTRACT

A method of forming a semiconductor structure includes growing an epitaxial doped layer over an exposed portion of a plurality of fins. The epitaxial doped layer combines the exposed portion of the fins to form a merged source and drain region. An implantation process occurs in the fins through the epitaxial doped layer to change the crystal lattice of the fins to form amorphized fins. A nitride layer is deposited over the semiconductor structure. The nitride layer covers the merged source and drain regions. A thermal treatment is performed in the semiconductor structure to re-crystallize the amorphized fins to form re-crystallized fins. The re-crystallized fins, the epitaxial doped layer and the nitride layer form a strained source and drain region which induces stress to a channel region.

15 Claims, 11 Drawing Sheets

(56) References Cited

U.S. PATENT DOCUMENTS

| | | | |
|---|---|---|---|
| 2011/0272763 A1* | 11/2011 | Sasaki et al. | 257/347 |
| 2012/0001197 A1* | 1/2012 | Liaw et al. | 257/77 |
| 2012/0018730 A1* | 1/2012 | Kanakasabapathy et al. | 257/66 |
| 2012/0070947 A1* | 3/2012 | Basker et al. | 438/197 |
| 2012/0171832 A1* | 7/2012 | Toh et al. | 438/300 |
| 2012/0276695 A1* | 11/2012 | Cheng et al. | 438/154 |
| 2013/0023103 A1 | 1/2013 | Yang et al. | |
| 2013/0093019 A1* | 4/2013 | Ando et al. | 257/347 |
| 2013/0187234 A1* | 7/2013 | Kanakasabapathy et al. | 257/368 |
| 2013/0200468 A1* | 8/2013 | Cai et al. | 257/401 |
| 2013/0319613 A1* | 12/2013 | Basker et al. | 156/345.24 |
| 2014/0035141 A1* | 2/2014 | Cheng et al. | 257/751 |
| 2014/0151814 A1* | 6/2014 | Giles et al. | 257/369 |

* cited by examiner

3D TRANSISTOR CHANNEL MOBILITY ENHANCEMENT

BACKGROUND

1. Field

The present invention generally relates to semiconductor devices, and more particularly to field effect transistor (FET) devices including FinFET structures having enhanced channel mobility, and a method for making the same.

2. Background of the Disclosure

Complementary Metal-oxide-semiconductor (CMOS) technology is commonly used for fabricating field effect transistors (FETs) as part of advanced integrated circuits (IC), such as CPUs, memory, storage devices, and the like. At the core of planar FETs, a channel region is formed in an n-doped or p-doped semiconductor substrate on which a gate structure is formed. Depending whether the on-state current is carried by electrons or holes, the FET comes as an n-FET or a p-FET. The overall fabrication process is well known in the art, and includes forming a gate structure over a channel region connecting a source and a drain region within the substrate on opposite ends of the gate, typically with some vertical overlap between the gate and the source and drain region. As integrated circuits continue to scale downward in size, fin field effect transistors (FinFETs) or tri-gate structures are becoming more widely used, primarily because FinFETs offer better performance than planar FETs at the same power budget. FinFETs are three dimensional (3-D), fully depleted metal-oxide semiconductor field effect transistor (MOSFET) devices having a fin structure formed from the semiconductor substrate material. The fins extent between the device source and drain enfolding the channel region forming the bulk of the semiconductor device. The gate structure is located over the fins covering the channel region. Such architecture allows for a more precise control of the conducting channel by the gate, significantly reducing the amount of current leakage when the device is in off state.

A common technique used in planar FETs manufacturing to enhance carrier mobility in the channel region is channel straining. Channel straining in planar FETs is usually achieved by filling source and drain recesses with a stressor material in order to induce a compressive or tensile strain to the channel region. In FinFET devices conventional channel straining methods are more difficult to apply mostly due to the small dimensions of FinFET elements. For example, in FinFET devices the fin structure cannot be recessed to form an embedded source and drain region as in planar FETs. Factors such as scaling of FinFET devices, FinFETs manufacturing materials and 3-D topography may impact effective channel straining if conducted using traditional straining techniques.

SUMMARY

According to an embodiment of the present invention, a method of forming a semiconductor structure includes: growing an epitaxial doped layer over a exposed portion of a plurality of fins, the epitaxial doped layer combines the exposed portion of the fins to form a merged source and drain region, implanting the fins through the epitaxial doped layer to change the crystal lattice of the fins to form amorphized fins, depositing a nitride layer over the semiconductor structure, the nitride layer covers the merged source and drain regions, annealing the semiconductor structure to re-crystallize the amorphized fins to form re-crystallized fins where the re-crystallized fins, the epitaxial doped layer and the nitride layer form a strained source and drain region which induces stress to a channel region.

According to another embodiment of the present invention, a semiconductor structure includes: a gate on a top surface of a semiconductor substrate, a plurality of fins on the top surface of the semiconductor substrate, the gate on top of the plurality of fins, a portion of the plurality of fins not covered by the gate defining a source and drain region, an epitaxial doped layer located over the portion of the fins not covered by the gate forming a merged source and drain region and a remaining portion of a nitride layer located on top and sidewalls of the merged source and drain region forming a strained source and drain region inducing stress to a channel region.

The present disclosure recognizes a problem with previously known techniques for forming semiconductor devices including when the ion implantation is performed sequentially in each region of the device, immediately following the formation of p-FET and/or n-FET doped epitaxial layers using the corresponding p-type or n-type dopants. The device can exhibit problems in the epitaxial layer implanted first due to over enhancement of dopant diffusion under the amorphized source and drain region. Ion implantation just after each epitaxial growth involves lattice amorphization and additional thermal budget of second epitaxial layer growth and re-crystallization annealing. This causes unintended dopant diffusion of amorphized fin areas. This in turn increases undesirable short channel effects in the device such as drain induced barrier lowering (DIBL) and leakage.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 2A, 2B through 10A, 10B depict a series of processing steps that illustrate an exemplary method of the present invention. In each set of figures, the A suffix figure is a cross sectional view of FIG. 1 taken along the line A-A, and the B suffix figure is a cross sectional view of FIG. 1 taken along the line B-B.

FIGS. 2A, 2B depict the deposition of first spacer material over the semiconductor structure according to an embodiment of the present disclosure.

FIGS. 10A, 10B depict the semiconductor structure shown in FIGS. 9A, 9B after etching the first and second nitride layers according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1:
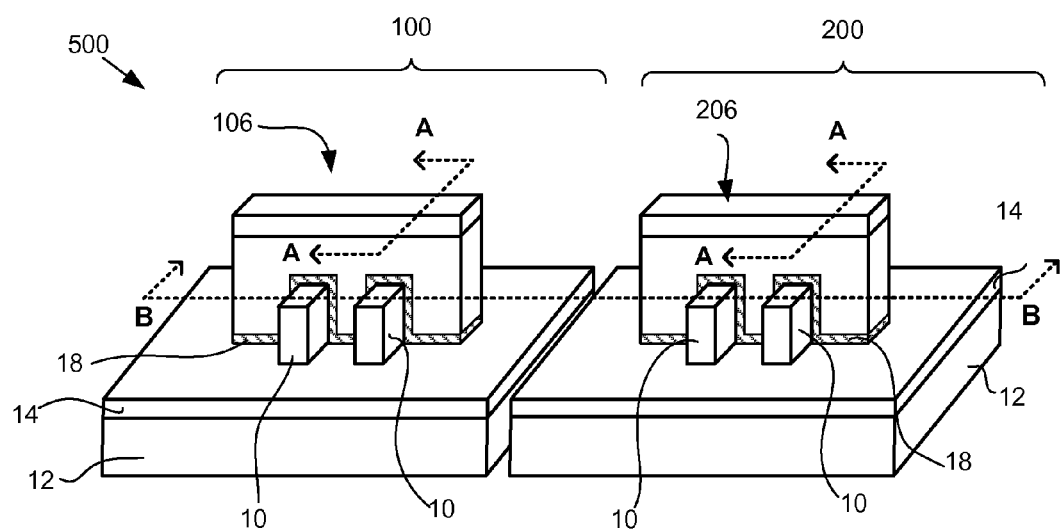
FIG. 1 is a 3D view of an initial semiconductor structure according to an embodiment of the present disclosure.

Referring to FIG. 1, a 3-dimensional (3D) view of a semiconductor structure 500 is shown. At this step of fabrication process, the semiconductor structure 500 may include an n-FET region 100 and a p-FET region 200. An n-FET device may be fabricated in the n-FET region 100 and a p-FET device may be fabricated in the p-FET region 200. The n-FET and p-FET devices may be formed on a single semiconductor substrate. In circuit applications individual devices may be separated from one another both physically and electrically by isolation regions located within the semiconductor substrate. Such isolation regions are well known in the art. Usually at this stage of the fabrication process an n-FET gate 106 and a p-FET gate 206 may be already formed in the semiconductor structure 500.

The sequence of figures from FIG. 1 to FIG. 11 shows the evolution of the semiconductor structure 500 through a series of processing steps. In order to improve clarity, reference numerals in the 100 range correspond to elements specific to the n-FET region 100 while reference numerals in the 200 range correspond to elements specific to the p-FET region 200. Furthermore, the same reference numeral may be used to indicate elements that are the same in both the n-FET region 100 and the p-FET region 200.

The semiconductor structure 500 may further include a semiconductor on insulator (SOI) substrate. The SOI substrate employed in the present disclosure may include a base substrate 12, a buried oxide (BOX) layer 14 formed on top of the base substrate 12 and a SOI layer (not shown) formed on top of the BOX layer 14. The BOX layer 14 isolates the SOI layer from the base substrate 12. The base substrate 12 may be made from any of several known semiconductor materials such as, for example, silicon, germanium, silicon-germanium alloy, silicon carbide, silicon-germanium carbide alloy, and compound (e.g. III-V and II-VI) semiconductor materials. The base substrate 12 may include a thickness ranging from about 700 µm to about 900 µm.

The BOX layer 14 may be formed from any known dielectric material. Non-limiting examples include: oxides, nitrides and oxynitrides of silicon. Oxides, nitrides and oxynitrides of other elements are also envisioned. In addition, the BOX layer 14 may include crystalline or non-crystalline dielectric materials. Moreover, the BOX layer 14 may be formed using any method known in the art, for example, ion implantation, thermal or plasma oxidation or nitridation methods, chemical vapor deposition (CVD) and physical vapor deposition (PVD). In one embodiment of the present disclosure, the BOX layer 14 may include a thickness ranging from about 10 nm to about 200 nm.

The SOI layer may include any of the several semiconductor materials included in the base substrate 12. In general, the base substrate 12 and the SOI layer may include the same semiconductor materials with respect to chemical composition, dopant concentration and crystallographic orientation. The SOI layer may be formed by any method known in the art including, but not limited to: separation by implantation of oxygen (SIMOX), wafer bonding and epitaxial layer transfer (ELTRAN®). In one embodiment of the present disclosure, the SOI layer may include a thickness ranging from about 10 nm to about 100 nm.

The initial semiconductor structure 500 may include a plurality of fins 10, the n-FET gate 106 and the p-FET gate 206. Both the n-FET gate 106 and the p-FET gate 206 may be formed over a portion of the fins 10. The fins 10 may be etched from the SOI substrate using typical photolithography techniques. The fins 10 may be primarily formed from the SOI layer of the SOI substrate. In some cases the SOI layer may be entirely consumed during the process of forming the fins. In one embodiment, the fins 10 may include a height of about 4 nm to about 40 nm, and a width of about 2 nm to about 20 nm.

The n-FET gate 106 and the p-FET gate 206 may include a gate dielectric layer 18 which may be formed by any method known in the art. The gate dielectric 18 may include a high-k dielectric material having a dielectric constant greater than, for example, 3.9, which is the dielectric constant of silicon oxide. The n-FET gate 106 and the p-FET gate 206 may be separated from the fins by the gate dielectric layer 18. The width of either the n-FET gate 106 or the p-FET gate 206 may determine the effective channel length of either the n-FET device or the p-FET device, respectively.

In another embodiment of the present invention, the n-FET gate 106 and the p-FET gate 206 may be formed using a gate last process where the initial gate structure may comprise a dummy polysilicon gate or dummy gate. A pair of device spacers can be disposed on opposite sidewalls of the dummy gate. The dummy gate and the pair of device spacers may then be surrounded by an inter-layer dielectric. Later, the dummy gate may be removed from between the pair of device spacers, as by, for example, an anisotropic vertical etch process, such as, a reactive ion etch (RIE). This creates an opening between the pair of device spacers where a metal gate may then be formed between the pair of device spacers. Optionally, a gate dielectric may be configured below the metal gate to separate the metal gate from the fins.

Referring to FIG. 2 through FIG. 11, exemplary process steps of forming FETs, such as FinFETs, having enhanced channel mobility in accordance with one embodiment of the present invention are shown, and will now be described in greater detail below. It should be noted that in each set of figures, the A suffix embodies a cross sectional view of FIG. 1 along section line A-A, while the B suffix embodies a cross sectional view of FIG. 1 along section line B-B.

Figure 2A:
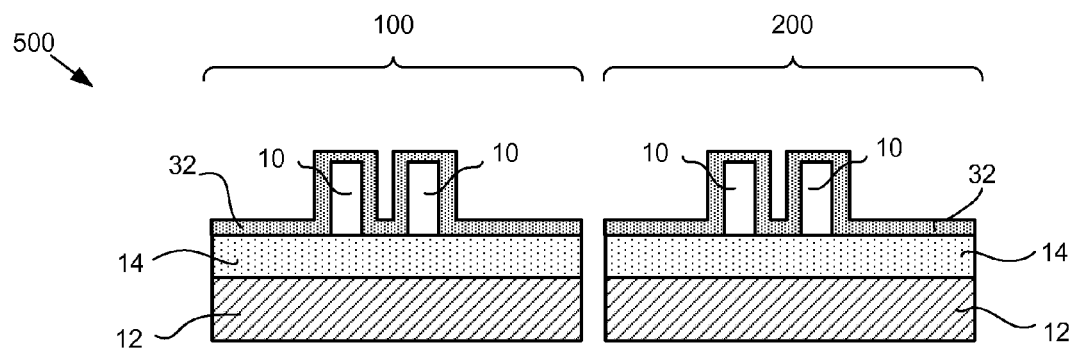
Figure 2B:
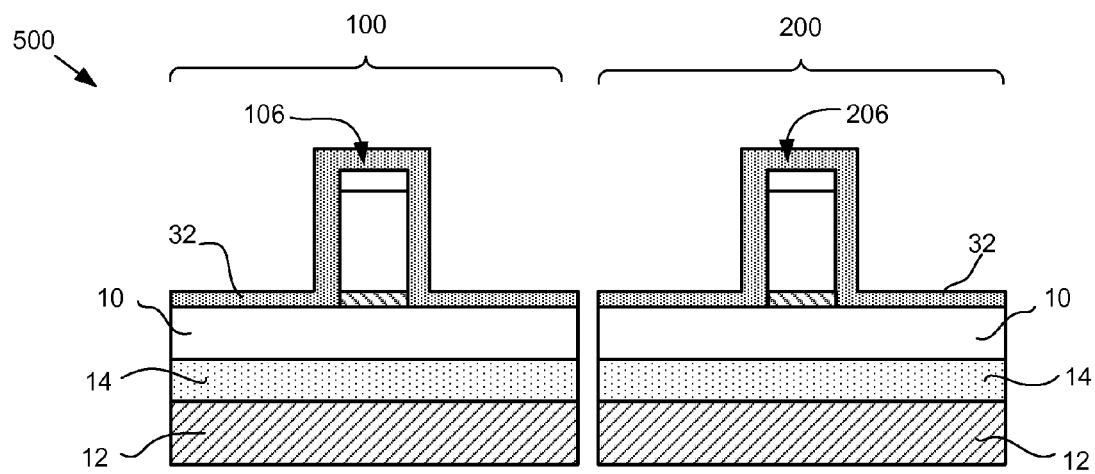

Referring now to FIGS. 2A and 2B, a cross sectional view of FIG. 1, along section line A-A, is shown in FIG. 2A and a cross sectional view of FIG. 1, along section line B-B, is shown in FIG. 2B. It should be noted that only the base substrate 12, the BOX layer 14 and the fins 10 are illustrated in FIG. 2A, and only the base substrate 12, the BOX layer 14, the fins 10 and the n-FET gate 106 and the p-FET gate 206 are illustrated in FIG. 2B.

First, a blanket layer of dielectric material may be deposited on top of the semiconductor structure 500 to form the first spacer material 32. The first spacer material 32 may cover the fins 10, the n-FET gate 106, and the p-FET gate 206. The first spacer material 32 may be deposited by any technique known in the art, for example, by chemical vapor deposition (CVD), atomic layer deposition (ALD), physical vapor deposition (PVD), or plasma enhanced chemical vapor deposition (PECVD). The first spacer material 32 may be made from an oxide, nitride, oxynitride, or any combination thereof. In one embodiment, the first spacer material 32 may have a thickness ranging from about 3 nm to about 20 nm. In one embodiment, the first spacer material 32 may include an iRAD nitride deposited using a CVD technique. The first spacer material 32 may untimely function as an offset sidewall spacer or first gate spacer for the p-FET device in the p-FET region 200.

Figure 3A:
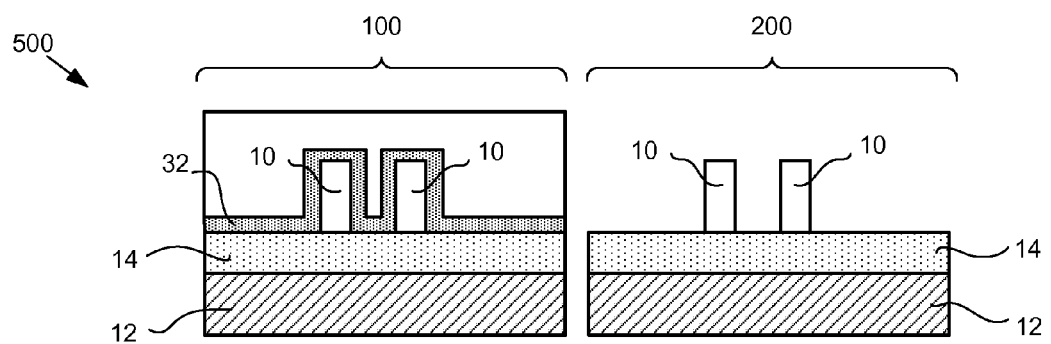
FIGS. 3A, 3B depict the formation of a gate spacer in the p-FET region according to an embodiment of the present disclosure.
Figure 3B:
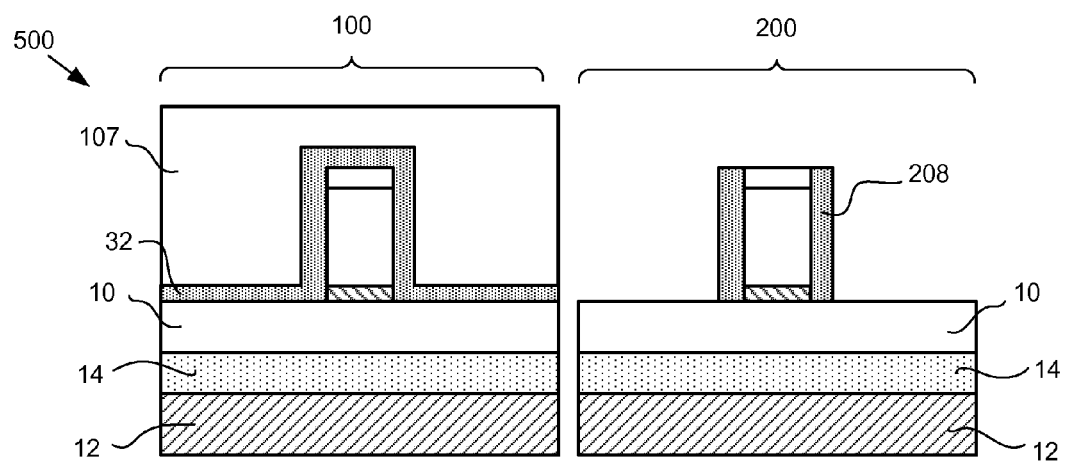

Referring now to FIGS. 3A, 3B, a portion of the first spacer material 32 may be selectively removed from the p-FET region 200; the first spacer material 32 may remain on sidewalls of the p-FET gate 206, as shown. The portion of the first spacer material 32 remaining on the sidewalls of the p-FET gate 206 may be referred to as a first gate spacer 208 or an offset spacer. The portion of the first spacer material 32 may be selectively removed from the p-FET region 200 using any removal technique known in the art. Suitable removal techniques may include a directional etching technique, such as, for example, reactive ion etching (RIE). A first mask 107 may be applied above the n-FET region 100 to protect the n-FET region 100 from the removal technique used to form the first gate spacer 108. The mask 107 can be a hardmask layer such as silicon nitride. The removal technique chosen to form the first gate spacer 208 may cause undercutting of the BOX layer 14 (not shown). The undercut may extend approximately 2 to approximately 30 nm into the BOX layer 14. Undercutting of the BOX layer 14 during formation of the first gate spacer 208 may result from poor etch selectivity between the first spacer material 32 and the BOX layer 14.

The first gate spacer 208 may generally include the same material and have a similar thickness to the dielectric spacer material 32 described above. In one embodiment, the first gate spacer 208 may have a thickness of approximately 8 nm.

Figure 4A:
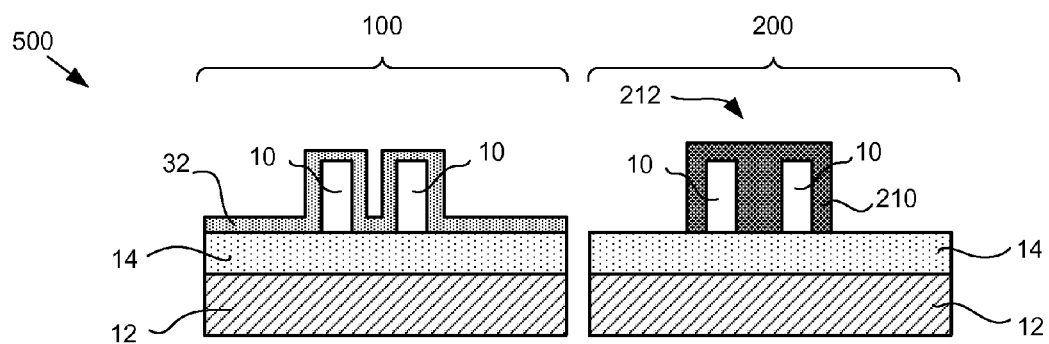
FIGS. 4A, 4B depict the formation of a merged source and drain region according to an embodiment of the present disclosure.
Figure 4B:
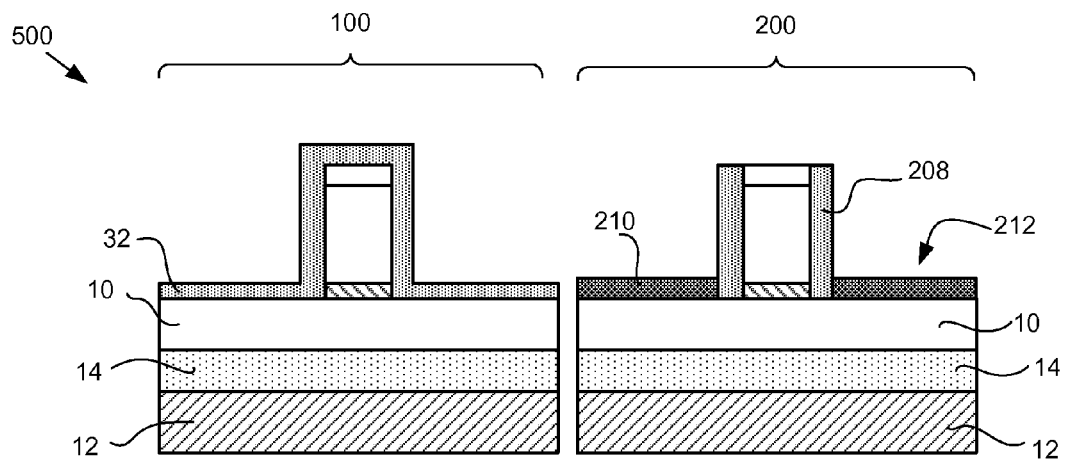

Referring now to FIGS. 4A, 4B, the first mask 107 (FIGS. 3A, 3B) may be removed from the n-FET region 100 and a merged source and drain region 212 may be formed on the fins 10 of the p-FET region 200. It should be noted that the dielectric spacer material 32 may remain above the fins 10 in the n-FET region 100 and the n-FET gate 106 to protect the n-FET region 100 during the formation of the merged source and drain region 212.

Next, formation of the merged source and drain region 212 may include selectively growing an in-situ doped epitaxial layer 210 on the exposed surfaces of the fins 10 in the p-FET region 200. The epitaxial layer 210 may be doped in-situ with a p-type dopant. The fins 10 may have the proper crystalline characteristics for accepting the epitaxial layer 210. The epitaxial layer 210 may merge the fins 10 to form a merged source and drain region 212 in the p-FET region 200 of the semiconductor structure 500.

Epitaxial growth is a known technique in the art. The structural consequence of epitaxial growth may be that a grown material and a host material, at their common interface, may include the same symmetry and crystalline orientation. Selective epitaxial growth may include epitaxial growth only on the exposed surfaces that may have proper crystalline qualities for accepting the growth material.

In the present case, only the fins 10 in the p-FET region 200 have the proper crystalline qualities to allow the epitaxial layer 210 to be grown. Similarly, epitaxial layer 210 may not be grown on the fins 10 of the n-FET region 100 because they are protected or covered by the first spacer material 32.

The epitaxial layer 210 may be grown by any suitable technique known in the art. A suitable technique may include for example, molecular beam epitaxy (MBE), CVD, ultra high vacuum CVD (UHCVD), and rapid thermal CVD (RTCVD).

In one embodiment, for example, the epitaxial layer 210 used to form the merged source and drain region 212 in the p-FET region 200 may include a silicon-germanium (SiGe) material, where the atomic concentration of germanium (Ge) may range from about 10% to about 80%. In another embodiment, the concentration of germanium (Ge) may range from about 25 to about 50%. The epitaxial layer 210 may have a larger lattice constant relative to the lattice constant of silicon (Si). By having a larger lattice constant, the epitaxial layer 210 may induce a compressive strain on the channel region of the p-FET device which may enhance carrier mobility and increase drive current. The p-type dopant may include any known dopant use in the fabrication of a p-FET, such as, for example, boron. In one embodiment, the dopant concentration may range from about $1\times10^{19}$ cm$^{-3}$ to about $2\times10^{21}$ cm$^{-3}$, and more preferably from about $1\times10^{20}$ cm$^{-3}$ to about $1\times10^{21}$ cm$^{3}$.

Figure 5A:
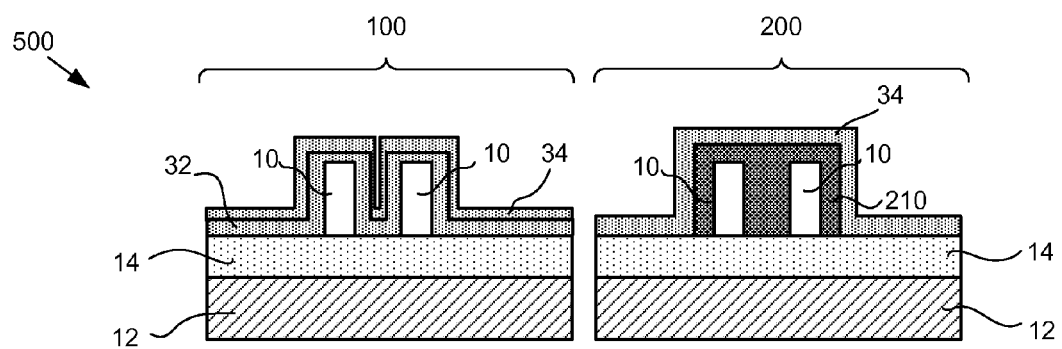
FIGS. 5A, 5B depict the deposition of a second spacer material over the semiconductor structure shown in FIGS. 4A, 4B according to an embodiment of the present disclosure.
Figure 5B:
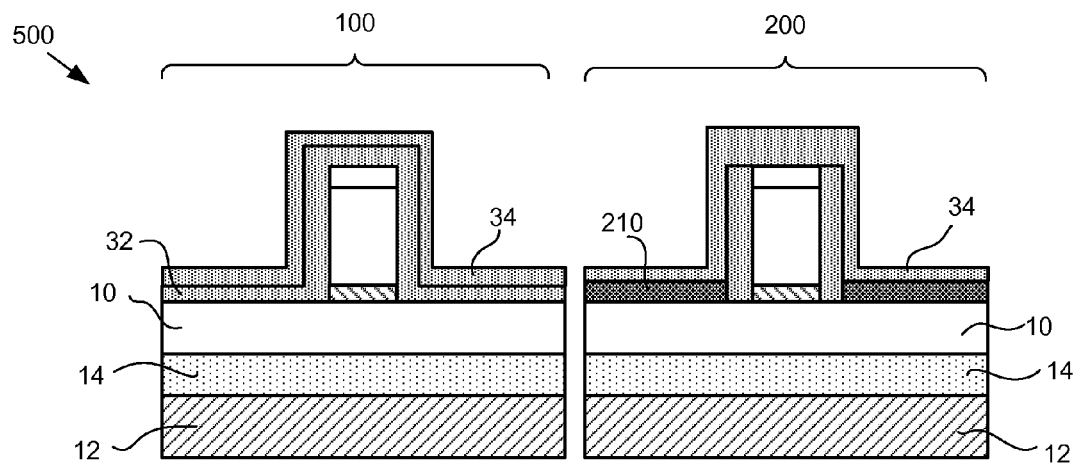

Referring now to FIGS. 5A, 5B, a similar procedure as described above with reference to FIGS. 2A, 2B through FIGS. 4A, 4B may be performed to form a merged source and drain region in the n-FET region 100 of the semiconductor structure 500. A blanket layer of dielectric material may be deposited on top of the semiconductor structure 500 to form a second spacer material 34. The second spacer material 34 may cover the fins 10, the merged source and drain region 212, the n-FET gate 106, and the p-FET gate 206. The second spacer material 34 may be deposited by any technique known in the art, for example, by chemical vapor deposition (CVD), atomic layer deposition (ALD), physical vapor deposition (PVD), or plasma enhanced chemical vapor deposition (PECVD). The second spacer material 34 may be made from an oxide, nitride, oxynitride, or any combination thereof. In one embodiment, the second spacer material 34 may have a thickness ranging from about 3 nm to about 15 nm. In one embodiment, the second spacer material 34 may include an iRAD nitride deposited using a CVD technique. The second spacer material 34 may untimely function as an offset sidewall spacer or second gate spacer for the n-FET device in the n-FET region 100.

Figure 6A:
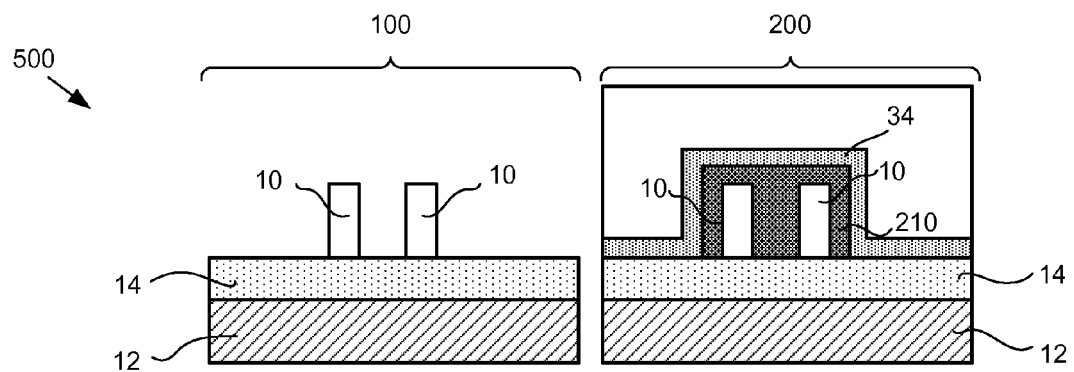
FIGS. 6A, 6B depict the p-FET region of the semiconductor structure being masked to form a gate spacer for the semiconductor structure n-FET region according to an embodiment of the present disclosure
Figure 6B:
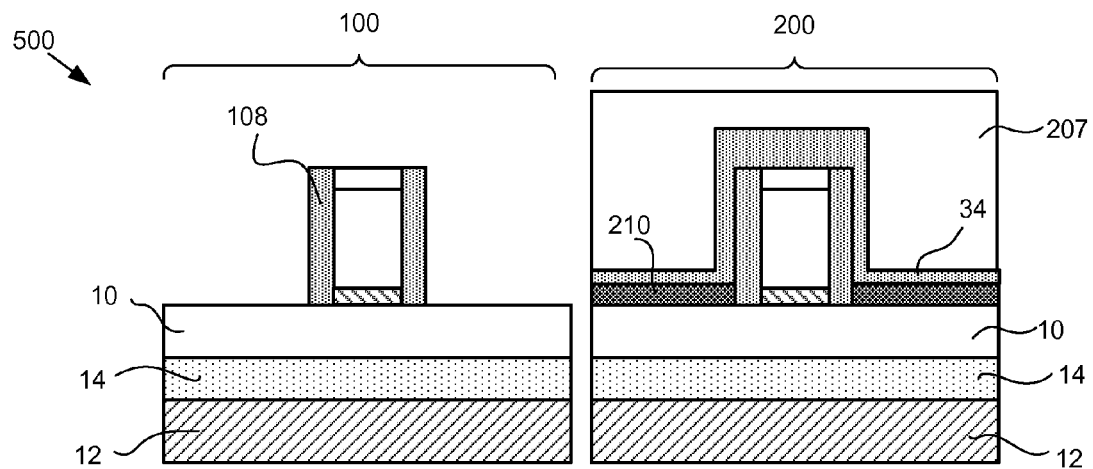

Referring now to FIGS. 6A, 6B, a portion of the first spacer material 32 and second spacer material 34 may be selectively removed from the n-FET region 100; the first spacer material 32 and second spacer material 34 may remain on sidewalls of the n-FET gate 106, as shown. The portion of the first spacer material 32 and second spacer material 34 remaining on the sidewalls of the n-FET gate 106 may be referred to as a second gate spacer 108 or an offset spacer. The portion of the first spacer material 32 and second spacer material 34 may be selectively removed from the n-FET region 100 using any removal technique known in the art. Suitable removal techniques may include a directional etching technique, such as, for example, reactive ion etching (RIE). A second mask 207 may be applied above the p-FET region 200 to protect the p-FET region 200 from the removal technique used to form the second gate spacer 208. The second mask 207 can be a hardmask layer such as silicon nitride. The removal technique chosen to form the second gate spacer 108 may cause undercutting of the BOX layer 14 (not shown). The undercut may extend approximately 2 to approximately 30 nm into the BOX layer 14. Undercutting of the BOX layer 14 during formation of the second gate spacer 108 may result from poor etch selectivity between the first and second spacer materials and the BOX layer 14.

The second gate spacer 108 may generally include the same material and have a similar thickness to the first spacer material 32 and second spacer material 34 described above. In one embodiment, the second gate spacer 108 may have a thickness of approximately 6 nm.

Figure 7A:
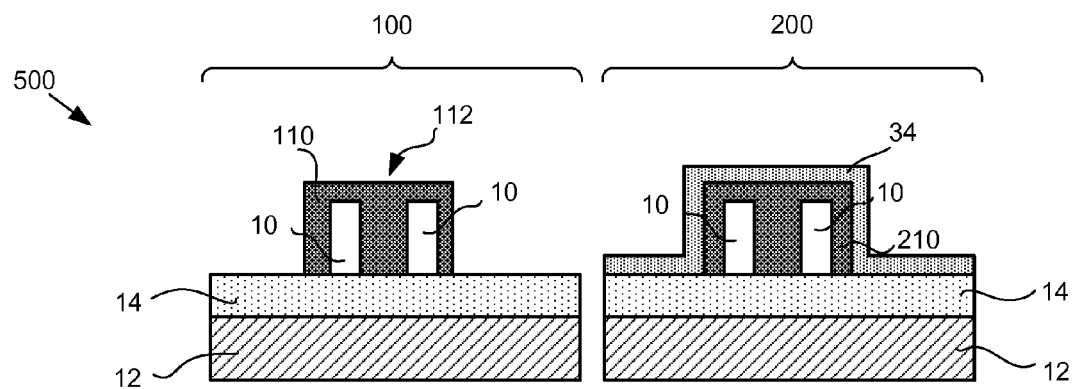
FIGS. 7A, 7B depict the formation of an epitaxial doped layer on top of the exposed area of the fins in the semiconductor structure n-FET region according to an embodiment of the present disclosure.
Figure 7B:
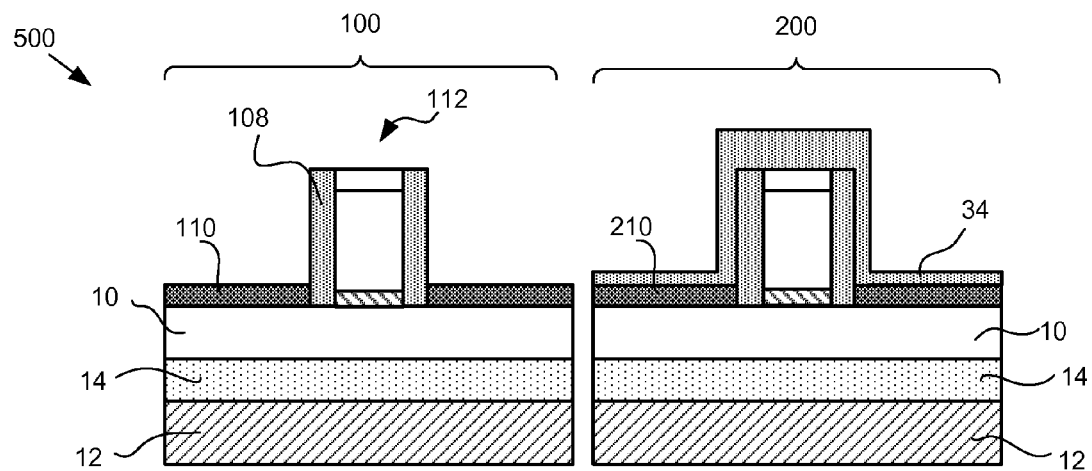

Referring now to FIGS. 7A, 7B, the second mask 207 (FIGS. 6A, 6B) may be removed from the p-FET region 200 and a merged source and drain region 112 may be formed on the fins 10 of the n-FET region 100. It should be noted that the dielectric spacer material 34 may remain above the fins 10 in the p-FET region 200 and the p-FET gate 206 to protect the p-FET region 200 during the formation of the merged source and drain region 112.

Next, formation of the merged source and drain region 112 may include selectively growing an in-situ doped epitaxial layer 110 on the exposed surfaces of the fins 10 in the n-FET region 100. The epitaxial layer 110 may be doped in-situ with an n-type dopant. The fins 10 may have the proper crystalline characteristics for accepting the epitaxial layer 110. The epitaxial layer 110 may merge the fins 10 to form a merged source and drain region 112 in the n-FET region 100 of the semiconductor structure 500.

In the present case, only the fins 10 in the n-FET region 100 have the proper crystalline qualities to allow the epitaxial layer 110 to be grown. Similarly, epitaxial layer 110 may not be grown on the fins 10 of the p-FET region 200 because they are protected or covered by the second spacer material 34.

The epitaxial layer 110 may be grown by any suitable technique known in the art. A suitable technique may include for example, molecular beam epitaxy (MBE), CVD, ultra high vacuum CVD (UHCVD), and rapid thermal CVD (RTCVD).

In one embodiment, for example, the epitaxial layer 110 used to form the merged source and drain region 112 in the n-FET region 100 may include a carbon-doped silicon (Si:C) material, where the atomic concentration of carbon (C) may range from about 0.2-3.0%. The epitaxial layer 110 may have a smaller lattice constant relative to the lattice constant of silicon (Si). By having a smaller lattice constant, the epitaxial layer 110 may induce a tensile strain on the channel region of the n-FET device which may enhance carrier mobility and increase drive current. The n-type dopant may include any known dopant use in the fabrication of an n-FET, such as, for example, phosphorus or arsenic. In one embodiment, the dopant concentration may range from about $1 \times 10^{19}$ cm$^{-3}$ to about $2 \times 10^{21}$ cm$^{-3}$, and more preferably from about $1 \times 10^{20}$ cm$^{-3}$ to about $1 \times 10^{21}$ cm$^{-3}$.

At this point of the manufacturing process, the second dielectric spacer material 34 may be removed from the p-FET region 200 by any method known in the art. In the processing steps described in FIGS. 2A, 2B through 7A, 7B, the merged source and drain region 212 of the p-FET region 200 was formed before the merged source and drain region 112 of the n-FET region 100. It should be noted that the merged source and drain regions may be similarly formed following the reverse order, with the merged source and drain region 112 of the n-FET region 100 formed before the merged source and drain region 212 of the p-FET region 200.

Figure 8A:
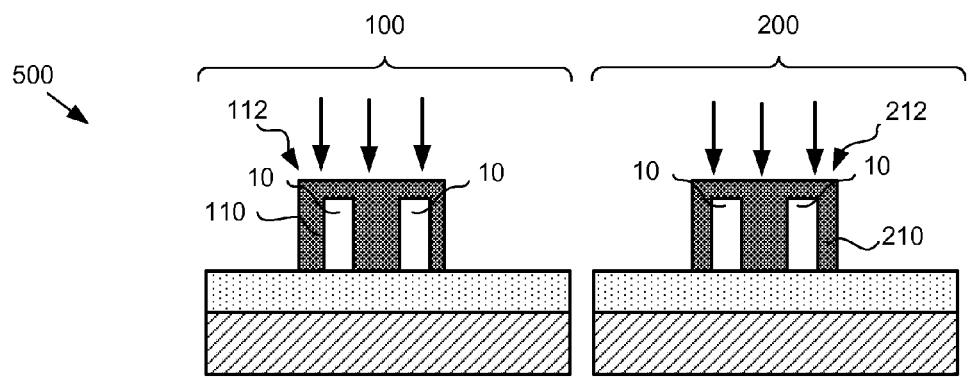
FIGS. 8A, 8B depict an ion implantation process conducted to amorphize the fins in the merged source and drain regions according to an embodiment of the present disclosure.
Figure 8B:
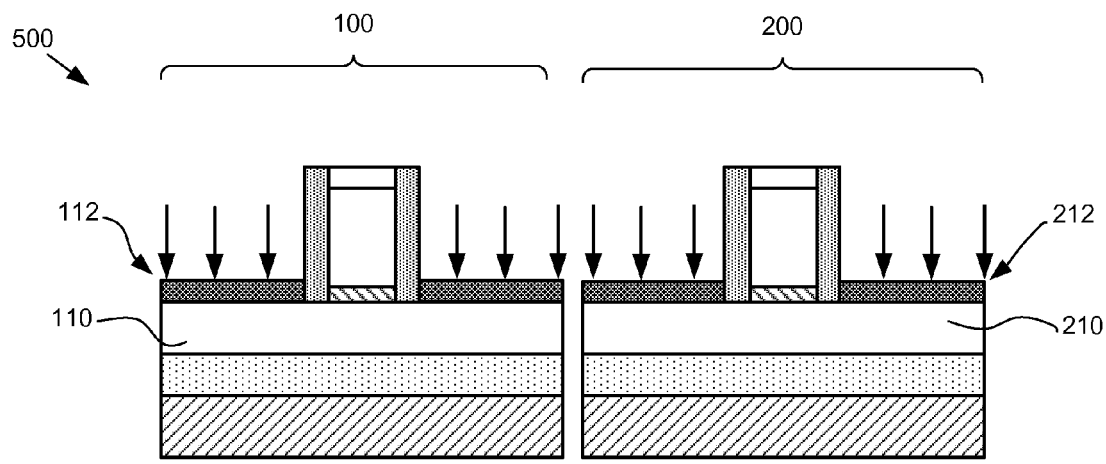

Referring now to FIGS. 8A, 8B, an ion implantation technique may be used to amorphize the fins 10 of the n-FET region 100 and the fins 10 of the p-FET region 200. The ion implantation technique (represented by arrows) may be conducted through the epitaxial layers 110, 210 to amorphize the fins 10 forming the merged source and drain regions 112, 212 resulting in amorphized fins 114 for the n-FET region 100 and amorphized fins 214 for the p-FET region 200 (shown in FIGS. 9A, 9B). The ion implantation process may be performed simultaneously in the fins of the p-FET region 100 and the fins of the n-FET region 200, after the epitaxial layers 110, 210 are formed. The ion implantation process may include neutral dopants, such as germanium (Ge) or argon (Ar).

For example, for both the n-FET region 100 and the p-FET region 200, the neutral dopants may comprise germanium (Ge) or argon (Ar) ions. The dopant concentration of germanium (Ge) to achieve amorphization may range from about $1 \times 10^{12}$ ions/cm$^2$ to about $9 \times 10^{12}$ ions/cm$^2$ with a tilt angle ranging from about 0 degrees to about 20 degrees and an implantation energy ranging from about 0.5 keV to about 5 keV. Furthermore, the dopant concentration of argon (Ar) to achieve amorphization may range from about $1 \times 10^{12}$ ions/cm$^2$ to about $9 \times 10^{12}$ ions/cm$^2$ with a tilt angle ranging from about 0 degrees to about 20 degrees and an implantation energy ranging from about 0.5 keV to about 5 keV.

Figure 9A:
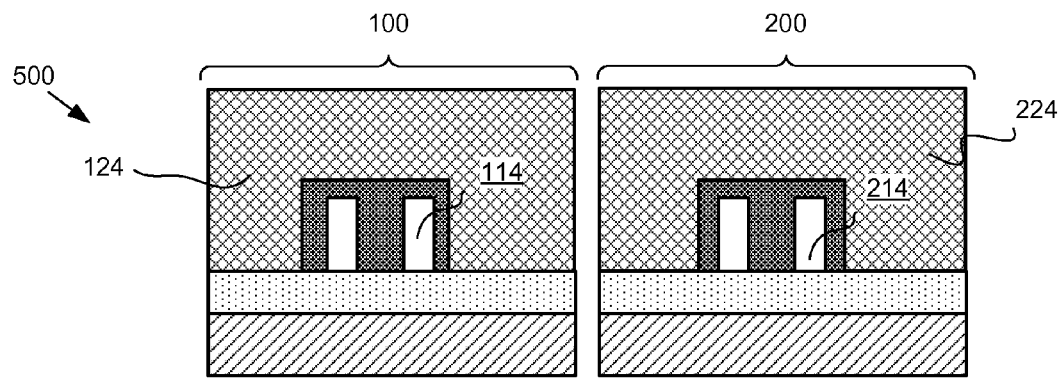
FIGS. 9A, 9B depict the deposition of a first nitride layer and a second nitride layer over the n-FET and p-FET regions respectively, according to an embodiment of the present disclosure.
Figure 9B:
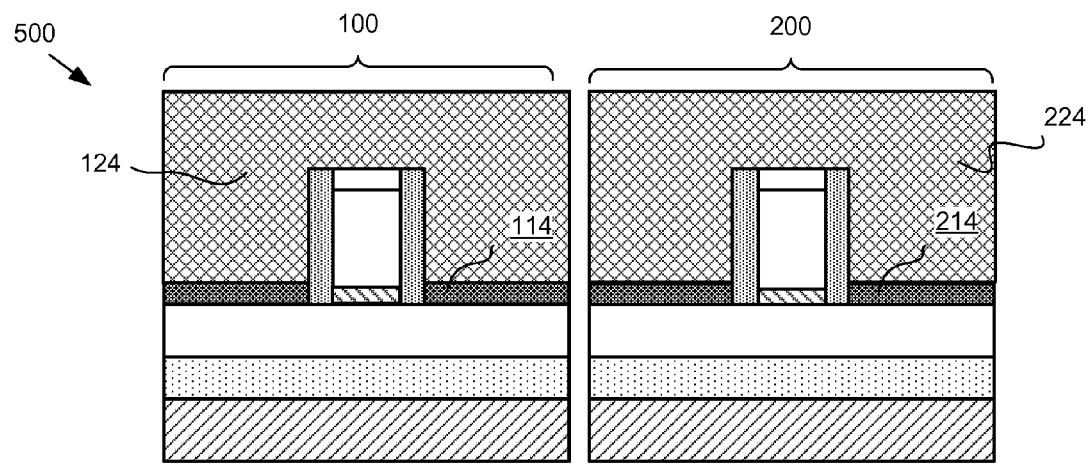

The ion implantation process may alter the crystal lattice of the fins resulting in amorphized fins 114, 214 (shown in FIGS. 9A, 9B). The ion implantation process may be conducted with the appropriated dopant concentration and depth so that the bottom (approximately 5-10 Å) of the amorphized fins 114, 214 may still be a crystal. During annealing of the amorphized fins 114, 214 (described below) this thin crystal layer may provide a template to re-crystallize the amorphized fins 114, 214 according to a nitride strain field.

The amorphization process may cause a crystalline disorder in the fins 10 area, resulting in an amorphous state for the fins 10 (instead of an orderly crystal state). After amorphization of the fins 10 due to implant damage, silicon atoms may re-arrange itself after annealing, according to an incorporated strain force as described below in FIGS. 9A, 9B through 10A, 10B. For example, if a tensile strain is applied, the fins 10 amorphized by the ion implant may subsequently exert a tensile strain.

Advantages of the present disclosure may be derived from the method as described herein, including discouraging dopant diffusion of amorphized fin areas, and thereby reducing short channel effect in the device.

Referring now to FIGS. 9A, 9B, following to the formation of the amorphized fins 114, 214, a first nitride layer 114 and a second nitride layer 214 may be deposited above the n-FET region 100 and the p-FET region 200 respectively. The first nitride layer 124 and the second nitride layer 224 may be formed by any deposition method known in the art, for example, by CVD. The first nitride layer 124 may exert a high tensile strain into the amorphized fins 114 of the n-FET region 100 while the second nitride layer 214 may exert a high compressive strain into the amorphized fins 214 of the p-FET region 200.

The first nitride layer 124 may be first deposited in the n-FET region 100 while a photoresist may be applied to the p-FET region 200 to delineate the nitride layer. Then the second nitride layer 224 may be deposited in the p-FET region 200 while a photoresist may be applied to the n-FET region 100 to delineate the nitride layer. The reverse deposition scheme may also be considered.

For example, for the n-FET region 100, the first nitride layer 124 may include a high tensile silicon nitride where the tensile strength may range from about 0.5-2.8 GPa. In an embodiment of the present disclosure, the applied tensile strength may be approximately 1.2 GPa. In such cases, the first nitride layer 124 may exert a high tensile strain on the amorphized fins 114.

For example, for the p-FET region 200, the second nitride layer 224 may include a high compressive silicon nitride where the compressive strength may range from about 2.0-4.0 GPa. In an embodiment of the present disclosure, the applied compressive strength may be approximately 3.0 GPa. In such cases, the second nitride layer 224 may exert a high compressive strain on the amorphized fins 214.

The first nitride layer 124 (n-FET region 100) and the second nitride layer 224 (p-FET region 200) may include a thickness in the range of about 30 nm to about 50 nm.

Figure 10A:
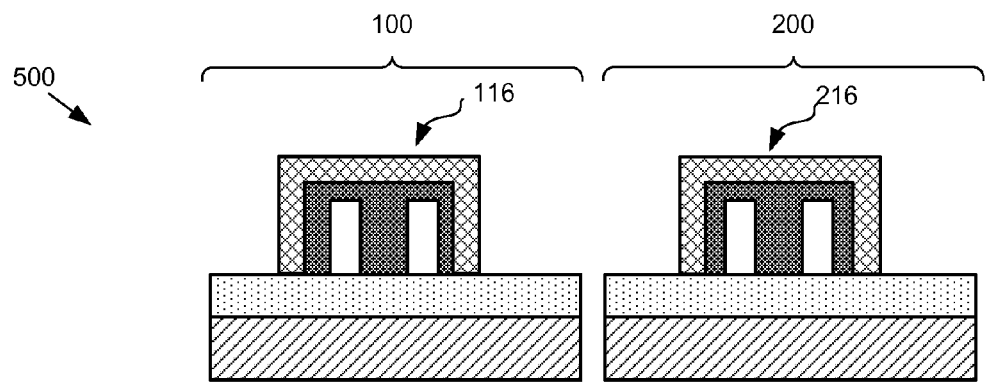
Figure 10B:
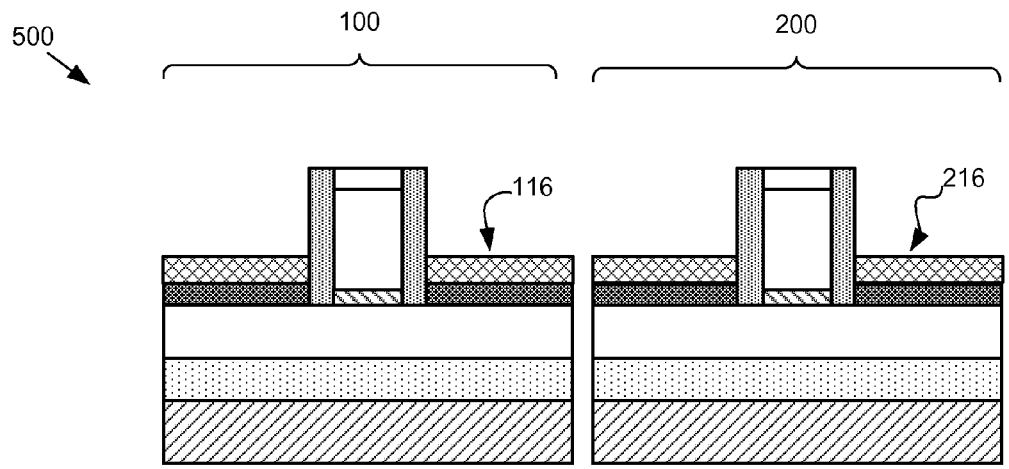

After deposition of the first nitride layer 124 in the n-FET region 100 and second nitride layer 224 in the p-FET region 200, the semiconductor structure 500 may be thermally treated in order to re-crystallize the amorphized fins 114, 214 forming re-crystallized fins (not shown). The thermal treatment may be conducted by any method known in the art, for example, rapid thermal annealing (RTA) of the semiconductor structure 500. In an embodiment of the present disclosure, the annealing temperature may range from about 800° C. to about 1100° C. The re-crystallization of the amorphized fins 114, 214 may lead to stacking fault formation in the fins, where the re-crystallized fins, the epitaxial doped layer and the nitride layer form strained source and drain regions 116, 216 (FIGS. 10A, 10B). The strained source and drain region 116 (shown in FIGS. 10A, 10B) may provide a tensile strain to the channel region of the n-FET region 100 while the strained source and drain region 216 (shown in FIGS. 10A, 10B) may provide a compressive strain to the channel region of the p-FET region 200.

Figure 11:
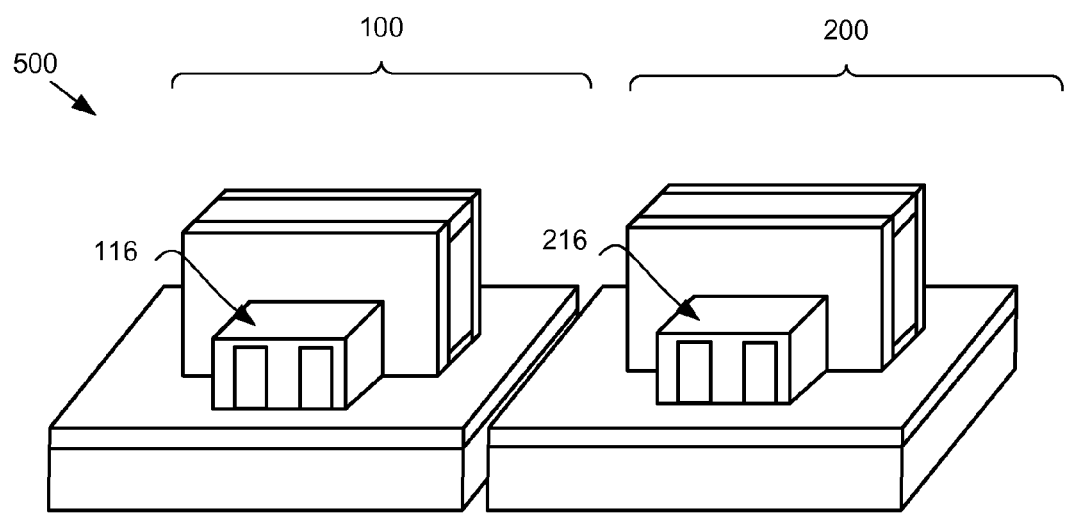
FIG. 11 depicts a 3D view of the semiconductor structure having strained source and drain regions according to an embodiment of the present disclosure.

Referring now to FIGS. 10A, 10B first and second nitride layers 124, 224 (FIGS. 9A, 9B) may be removed from the semiconductor structure 500 by any method known in the art, for example, by a reactive ion etching (RIE) technique to form the final semiconductor structure shown in FIG. 11. If required, combined chemical mechanical polishing (CMP) and RIE may be used to remove the first and second nitride layers 124, 224 (FIGS. 10A, 10B) from the semiconductor structure 500. A remaining portion of the first and second nitride layer may remain on a top and sidewalls of the merged source and drain regions 112, 212 forming the strained source and drain regions 116, 216. The semiconductor structure 500 may now include strained source and drain regions 116, 216 that may induce a high tensile or high compressive strain on the device channel region which may enhance electron mobility in the n-FET device and hole mobility in the p-FET device respectively, in turn improving device performance.

The steps previously described may provide a method for integration of FinFET devices including improved channel mobility as well as enhanced source and drain region resistance.

After removal of the first and second nitride layers 124, 224 (FIGS. 9A, 9B) and the corresponding formation of the strained source and drain regions 116, 216, the semiconductor structure manufacturing process may continue with the formation of embedded silicide contacts (not shown) in the strained source and drain regions 116, 216. The embedded silicide contacts may be patterned by means of a photolithography process. Following the photolithography process, areas of the underlying substrate may be etched to create contact holes and then a metal layer (not shown) may be deposited over the semiconductor substrate by means of any deposition method known in the art including, for example, by CVD. In one embodiment of the present disclosure, the metal layer (not shown) may include a nickel-platinum alloy (NiPt) where the atomic concentration of nickel (Ni) may range from about 70-95%. In another embodiment of the present disclosure, the metal layer may comprise nickel palladium (NiPd), nickel rhenium (NiRe), titanium (Ti), titanium tantalum (TiTa), titanium niobium (TiNb), or cobalt (Co). Alternatively, other metals commonly employed in salicide processing such as tantalum (Ta), tungsten (W), cobalt (Co), nickel (Ni), platinum (Pt), palladium (Pd), or alloys thereof may be employed.

After the metal layer is formed, the semiconductor structure 500 may be subjected to a thermal annealing process, using conventional processes such as, but not limited to, RTA. During the thermal annealing process, the metal layer reacts with the silicon present in the substrate to form a metal silicide. After the annealing process, an etching process may be carried out to remove substantially all un-reacted metal or metal alloy of the remaining portion of the metal layer. The etching process may comprise a wet etching method.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure, comprising:

forming a plurality of fins substantially parallel to each other on a top surface of a semiconductor substrate, a gate positioned perpendicular and on top of the plurality of fins, a first portion of each of the plurality of fins being under the gate forming a channel region, and a second portion of each of the fins not covered by the gate, extending outwardly from the first portion of the fins to form a source and drain region;

forming a gate spacer adjacent to the wall of the gate and over a part of the second portion of the plurality of fins;

growing an epitaxial doped layer over the second portion of the plurality of fins, wherein the epitaxial doped layer combines the second portion of the plurality of fins to form a merged source and drain region;

implanting neutral dopants into the second portion of the plurality of fins through the epitaxial doped layer to form amorphized fins, wherein the first portion of each of the plurality of fins is not amorphized maintaining its original lattice constant;

depositing a nitride layer over the semiconductor substrate, the nitride layer being on a top of the epitaxial doped layer covering the amorphized fins;

annealing the semiconductor structure to re-crystallize the amorphized fins to form re-crystallized fins, wherein the re-crystallized fins, the epitaxial doped layer and the nitride layer form a strained source and drain region; and partially removing the nitride layer from the semiconductor structure, wherein a portion of the nitride layer remains on a top surface and a sidewall of the merged source and drain region, wherein a mismatch between a lattice constant of the strained source and drain region and the original lattice constant of the channel region applies a stress to the channel region for enhanced carrier mobility.

2. The method of claim 1, wherein growing the epitaxial doped layer comprises:

epitaxially growing silicon-germanium (SiGe) over a top surface and sidewalls of the plurality of fins in a p-FET region.

3. The method of claim 1, wherein growing the epitaxial doped layer comprises:

epitaxially growing carbon-doped silicon (Si:C) over a top surface and sidewalls of the plurality of fins in an n-FET region.

4. The method of claim 1, wherein growing the epitaxial doped layer comprises:

doping the epitaxial doped layer in-situ with p-type dopants in the case of a p-FET device or n-type dopants in the case of an n-FET device.

5. The method of claim 1, wherein forming the merged source and drain region comprises:

forming the merged source and drain region in the p-FET region of the p-FET device before forming the merged source and drain region in the n-FET region of the n-FET device or vice versa.

6. The method of claim 1, wherein implanting the fins comprises:

implanting neutral dopants into the plurality of fins of a p-FET region and into the plurality of fins of an n-FET region of the semiconductor substrate simultaneously.

7. The method of claim 6, wherein implanting the neutral dopants comprises:

using germanium or argon ions to amorphize the plurality of fins.

8. The method of claim 1, wherein depositing the nitride layer comprises:

depositing a first nitride layer in the n-FET region followed by depositing a second nitride layer in the p-FET region or vice versa.

9. The method of claim 8, wherein depositing the first nitride layer in the n-FET region comprises:

forming a high tensile strain silicon nitride over the exposed portion of the plurality of fins.

10. The method of claim 8, wherein depositing the second nitride layer in the p-FET region comprises:

forming a high compressive strain silicon nitride over the exposed portion of the plurality of fins.

11. The method of claim 1, wherein the strained source and drain region comprises:

forming a high compressive strain silicon nitride for increasing hole mobility in a p-FET device or a high tensile strain silicon nitride for increasing electron mobility in a n-FET device.

12. The method of claim 1, wherein forming the gate comprises:

forming a dummy gate; and replacing the dummy gate with a metal gate.

13. The method of claim 1, further comprising:

depositing a first spacer material over an n-FET region and a p-FET region of the semiconductor structure;

masking the n-FET region and directionally etching the first spacer material to form a first gate spacer for a p-FET gate of the semiconductor structure;

unmasking the n-FET region to selectively growth the doped epitaxial layer to form the merged source and drain region in the p-FET region of the semiconductor structure;

depositing a second spacer material over the n-FET region and the p-FET region of the semiconductor structure;

masking the p-FET region and directionally etching the first spacer material and second spacer material to form a second gate spacer for an n-FET gate of the semiconductor structure; and unmasking the p-FET region to selectively growth the doped epitaxial layer to form the merged source and drain region in the n-FET region of the semiconductor structure.

14. The method of claim 13, wherein depositing the first spacer material and the second spacer material comprises:

using an iRAD nitride.

15. The method of claim 1, further comprising:

forming embedded silicide contacts in the strained source and drain region.

* * * * *